US011239337B2

(12) United States Patent
Yoshida

(10) Patent No.: US 11,239,337 B2
(45) Date of Patent: Feb. 1, 2022

(54) SEMICONDUCTOR DEVICE AND METHOD OF MANUFACTURING SAME

(71) Applicant: Renesas Electronics Corporation, Tokyo (JP)

(72) Inventor: Tetsuya Yoshida, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 17/110,493

(22) Filed: Dec. 3, 2020

(65) Prior Publication Data

US 2021/0091203 A1 Mar. 25, 2021

Related U.S. Application Data

(62) Division of application No. 16/055,050, filed on Aug. 4, 2018, now Pat. No. 10,886,379.

(30) Foreign Application Priority Data

Sep. 28, 2017 (JP) ................. 2017-187976

(51) Int. Cl.
*H01L 21/02* (2006.01)
*H01L 29/51* (2006.01)
(Continued)

(52) U.S. Cl.
CPC .......... *H01L 29/513* (2013.01); *H01L 21/022* (2013.01); *H01L 21/02178* (2013.01); *H01L 21/02181* (2013.01); *H01L 21/02194* (2013.01); *H01L 21/02244* (2013.01); *H01L 21/02249* (2013.01); *H01L 21/84* (2013.01);
(Continued)

(58) Field of Classification Search
CPC .......... H01L 29/1087; H01L 29/66628; H01L 21/02249; H01L 21/02244; H01L 27/092; H01L 29/4908; H01L 29/6656; H01L 21/02178; H01L 21/02194; H01L 29/517; H01L 29/6653; H01L 29/78621; H01L 21/02181; H01L 27/1203; H01L 21/84; H01L 21/022; H01L 29/665; H01L 29/41725; H01L 29/518
See application file for complete search history.

(56) References Cited

U.S. PATENT DOCUMENTS 7,226,795 B2 6/2007 Sakai
10,424,517 B2 * 9/2019 Tseng .............. H01L 21/823857
(Continued)

FOREIGN PATENT DOCUMENTS

JP 2007-318012 A 12/2007
JP 2016-018936 A 2/2016

*Primary Examiner* — Earl N Taylor
(74) *Attorney, Agent, or Firm* — SGPatents PLLC

(57) ABSTRACT

To provide a semiconductor device having improved reliability. The semiconductor device has, on a SOI substrate thereof having a semiconductor substrate, an insulating layer, and a semiconductor layer, a gate insulating film having an insulating film and a high dielectric constant film. The high dielectric constant film has a higher dielectric constant than a silicon oxide film and includes a first metal and a second metal. In the high dielectric constant film, the ratio of the number of atoms of the first metal to the total number of atoms of the first metal and the second metal is equal to or more than 75%, and less than 100%.

10 Claims, 12 Drawing Sheets

(51) Int. Cl.

| | |
|---|---|
| *H01L 29/417* | (2006.01) |
| *H01L 29/66* | (2006.01) |
| *H01L 21/84* | (2006.01) |
| *H01L 27/12* | (2006.01) |
| *H01L 29/786* | (2006.01) |
| *H01L 29/49* | (2006.01) |
| *H01L 27/092* | (2006.01) |
| *H01L 29/10* | (2006.01) |
| *H01L 21/8238* | (2006.01) |

(52) U.S. Cl.
CPC ........ *H01L 27/092* (2013.01); *H01L 27/1203* (2013.01); *H01L 29/1087* (2013.01); *H01L 29/41725* (2013.01); *H01L 29/4908* (2013.01); *H01L 29/517* (2013.01); *H01L 29/518* (2013.01); *H01L 29/665* (2013.01); *H01L 29/6653* (2013.01); *H01L 29/6656* (2013.01); *H01L 29/66628* (2013.01); *H01L 29/78621* (2013.01); *H01L 21/823857* (2013.01)

(56) References Cited

U.S. PATENT DOCUMENTS

| | | | |
|---|---|---|---|
| 2004/0135217 A1* | 7/2004 | Yamamoto | H01L 29/517 257/410 |
| 2006/0197107 A1* | 9/2006 | Kanamura | H01L 29/7787 257/194 |
| 2007/0284675 A1* | 12/2007 | Kimizuka | H01L 29/4958 257/410 |
| 2008/0017914 A1 | 1/2008 | Natori et al. | |
| 2008/0237688 A1* | 10/2008 | Yasuda | H01L 29/513 257/316 |
| 2009/0078990 A1* | 3/2009 | Yasuda | H01L 29/4234 257/326 |
| 2010/0219481 A1* | 9/2010 | Tseng | H01L 29/513 257/369 |
| 2011/0284971 A1* | 11/2011 | Sakashita | H01L 27/092 257/369 |
| 2012/0056268 A1* | 3/2012 | Mizutani | H01L 28/20 257/369 |
| 2013/0062684 A1 | 3/2013 | Ding et al. | |
| 2013/0207203 A1* | 8/2013 | Tomimatsu | H01L 29/66477 257/411 |
| 2015/0060991 A1* | 3/2015 | Mizutani | H01L 21/02148 257/324 |
| 2016/0013287 A1* | 1/2016 | Yamamoto | H01L 29/0607 257/349 |
| 2017/0062621 A1 | 3/2017 | Hayashi | |
| 2019/0097018 A1* | 3/2019 | Yoshida | H01L 21/02249 |

* cited by examiner

SEMICONDUCTOR DEVICE AND METHOD OF MANUFACTURING SAME

CROSS-REFERENCE TO RELATED APPLICATIONS

The disclosure of Japanese Patent Application No. 2017-187976 filed on Sep. 28, 2017 including the specification, drawings, and abstract is incorporated herein by reference in its entirety.

BACKGROUND

The present invention relates to a semiconductor device and a method of manufacturing the same, for example, a technology effective when applied to a semiconductor device using an SOI substrate.

There is a technology of forming, as a semiconductor device for low power consumption, a MISFET (metal insulator semiconductor field effect transistor) on a SOI (silicon on insulator) substrate. With the miniaturization of a MISFET, use of a high dielectric constant film called "High-k film" is being investigated to obtain a gate insulating film having an improved thickness in terms of silicon oxide.

For example, Patent Document 1 discloses a technology of using hafnium oxide ($HfO_2$) or the like as a high dielectric constant film for a gate insulating film of a MISFET formed on a SOI substrate.

Patent Document 2 discloses a technology of providing, on an interface between a gate insulating film and a gate electrode of a MISFET, a metal layer made of hafnium (Hf) or zirconium (Zr).

Patent Document 1: Japanese Unexamined Patent Application Publication No. 2016-18936

Patent Document 2: Japanese Unexamined Patent Application Publication No. 2007-318012

SUMMARY

As one of threshold adjustment methods of a MISFET formed on a SOI substrate, there is a method of controlling the threshold by the work function of a metal contained in a high dielectric constant film. Such a high dielectric constant film is known to have more trap levels than a silicon oxide film and the MISFET may have deteriorated reliability, depending on the proportion of a metal contained in the high dielectric constant film.

The other problems and novel features will be apparent from the description herein and accompanying drawings.

According to one embodiment, a semiconductor device has a semiconductor substrate, an insulating layer formed on the semiconductor substrate, a semiconductor layer formed on the insulating layer, a first gate insulating film including a first insulating film formed on the semiconductor layer and a high dielectric constant film formed on the first insulating layer, and a first gate electrode formed on the first gate insulating film. In this device, the high dielectric constant film is a film having a higher dielectric constant than a silicon oxide film and at the same time, containing a first metal and a second metal. In the high dielectric constant film, the ratio of the number of atoms of the first metal to the total number of atoms of the first metal and the second metal is equal to or more than 75%, and less than 100%.

According to another embodiment, a method of manufacturing a semiconductor device has (a) a step of providing a semiconductor substrate, an insulating layer formed on the semiconductor substrate, and a semiconductor layer formed on the insulating layer, (b) a step of forming a first insulating film on the semiconductor layer, (c) a step of depositing a metal film on the first insulating film, and (d) heat treating the metal film. In this method, the metal film contains a first metal and a second metal, and the ratio of the number of atoms of the first metal to the total number of atoms of the first metal and the second metal is equal to or more than 75%, and less than 100%.

According to a further embodiment, a method of manufacturing a semiconductor device has (a) a step of providing a semiconductor substrate, an insulating layer formed on the semiconductor substrate, and a semiconductor layer formed on the insulating layer, (b) a step of forming a first insulating film on the semiconductor layer, (c) a step of forming a first metal film and a second metal film on the first insulating film, and (d) heat treating the first metal film and the second metal film.

According to the above embodiment, a semiconductor device having improved reliability can be provided.

DETAILED DESCRIPTION

Figure 1:
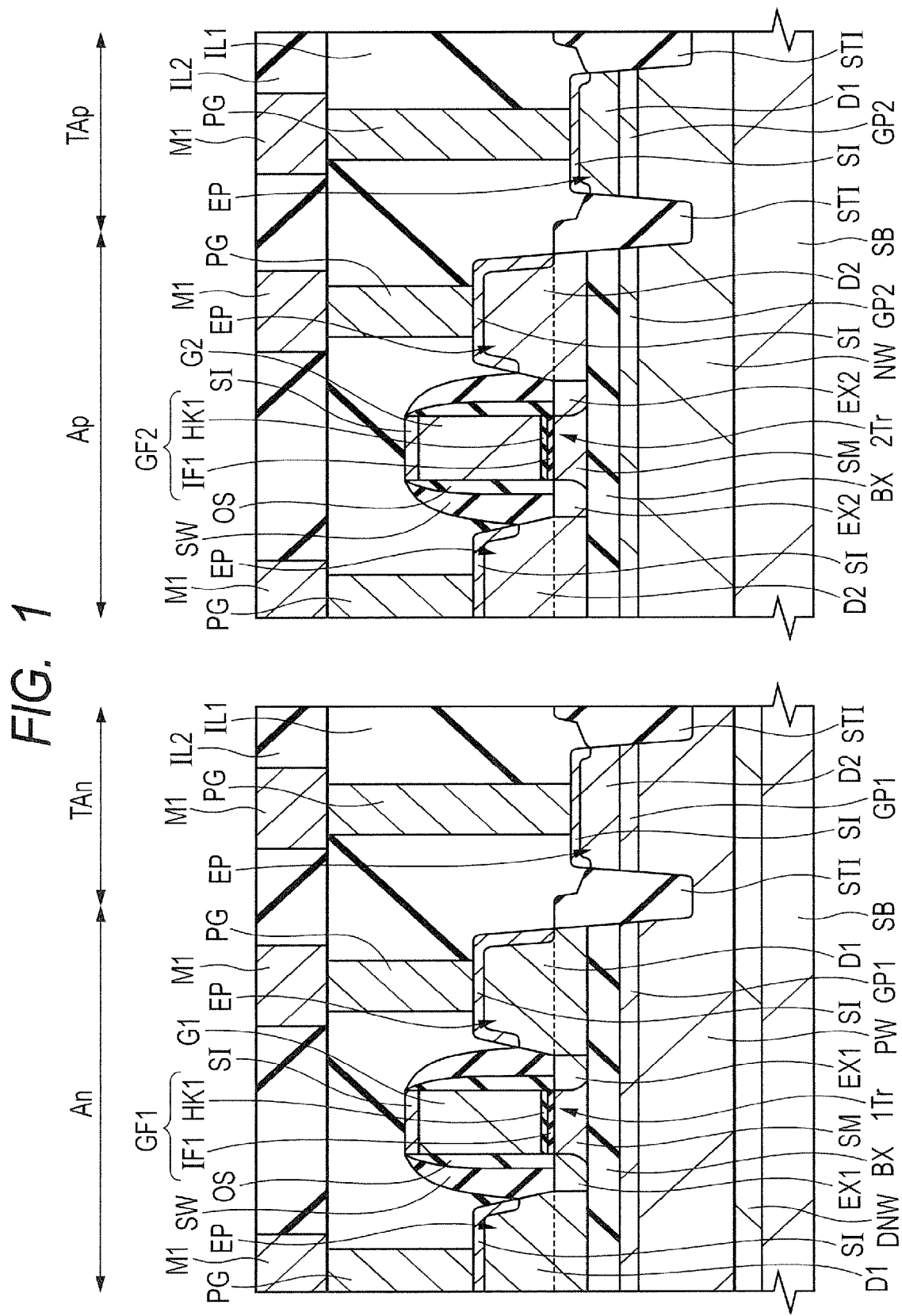
FIG. 1 is a cross-sectional view showing a semiconductor device of First Embodiment.

In the below-described embodiments, a description will be made after divided into a plurality of sections or embodiments if necessary for the sake of convenience. These sections or embodiments are not independent from one another unless otherwise particularly specified, but one of them may be a modification example, details, a complementary description, or the like of a part or whole of the other one. In the below-described embodiments, when a reference is made to the number or the like (including the number, value, amount, range, or the like) of a component, the number is not limited to a specific number but may be more or less than the specific number, unless otherwise particularly specified or principally apparent that the number is limited to the specific number. Further, it is needless to say that in the below-described embodiments, the constituent component (including component step or the like) is not always essential unless otherwise particularly specified or principally apparent that it is essential. Similarly, in the below-described embodiments, when a reference is made to the shape, positional relationship, or the like of the constituent component, a component substantially approximate or analogous thereto in shape or the like is also embraced unless otherwise particularly specified or principally apparent that it is not. This also applies to the above-described number and range.

The embodiments will hereinafter be described in detail based on some drawings. In all the drawings for describing the following embodiments, members having the same function will be identified by the same reference numerals and overlapping descriptions will be omitted. In the below-described embodiments, a description on the same or similar portions is not repeated in principle unless otherwise particularly necessary.

From the drawings used in the embodiments, hatching is sometimes omitted to facilitate understanding of them.

First Embodiment

FIG. 1 shows the respective cross-sectional structures of an n type MISFET1Tr and a p type MISFET2Tr which are semiconductor devices of the present embodiment.

The semiconductor device of the present embodiment has a region An in which an n type MISFET1Tr is formed, a region TAn for supplying a well region PW of the region An with electricity, a region Ap in which a p type MISFET2Tr is formed, and a region TAp for supplying a well region NW of the region Ap with electricity.

The region An and the region TAn are partitioned by an element isolation portion STI formed in a semiconductor substrate SB. The well region PW is deeper than the element isolation portion STI and it extends over both the region An and the region TAn. The region Ap and the region TAp are partitioned by an element isolation portion STI. The well region NW is deeper than the element isolation portion STI and it extends over both the region Ap and the region TAp.

The semiconductor substrate SB has an insulating layer BX thereon and the insulating layer BX has a semiconductor layer SM thereon. The insulating layer BX has a thickness of from about 10 to 20 nm and the semiconductor layer SM has a thickness of from about 10 to 20 nm. In the region TAn and the region TAp which are electricity supply regions, the insulating layer BX and the semiconductor layer SM are removed. This makes it possible to apply voltages to the well region PW and the well region NW, respectively, via the epitaxial layer EP.

First, the structure of the MISFET1Tr in the region An will be described.

In the region An, the semiconductor substrate SB has therein an n type well region DNW and the well region DNW has therein a p type well region PW. By this well region DNW, the well region PW is electrically separated from the semiconductor substrate SB. The well region PW contiguous to the insulating layer BX has, on the surface thereof, a p type ground plane region (impurity region) GP1 having a higher impurity concentration than the well region PW. The ground plane region GP1 functions as a back gate of the MISFET1Tr and the threshold voltage of the MISFET1Tr is adjusted by an internal potential of the ground plane region GP1.

The well region PW and the ground plane region GP1 are regions having a p type impurity such as boron (B) introduced therein. The well region PW has an impurity concentration of from about $5 \times 10^{17}$ to $5 \times 10^{18}$/cm$^3$ and the ground plane region GP1 has an impurity concentration of from about $1 \times 10^{18}$ to $2 \times 10^{19}$/cm$^3$.

The semiconductor layer SM in the region An has thereon a gate electrode G1 via a gate insulating film GF1. Here, the gate insulating film GF1 includes an insulating film IF1 comprised mainly of a silicon oxide film and a high dielectric constant film HK1 formed on the insulating film IF1. The high dielectric constant film HK1 has a higher dielectric constant than a silicon oxide film, serves to adjust the threshold of the MISFET1Tr, and includes at least a first metal and a second metal different from the first metal. In the present embodiment, the first metal is, for example, hafnium (Hf), the second metal is, for example, aluminum (Al), and the high dielectric constant film HK1 contains Hf, Al, and O.

More specifically, the high dielectric constant film HK1 in the present embodiment is made of $Hf_xAl_{(1-x)}ON$ (1>X≥0.75) or $Hf_xAl_{(1-x)}O$ (1>X≥0.75). This means that in the high dielectric constant film HK1, the ratio of the number of atoms of the first metal (Hf) to the total number of atoms of the first metal and the second metal (Hf+Al) is equal to or more than 75%, and less than 100%.

The gate electrode G1 has, on the side surface thereof, a sidewall spacer SW via an offset spacer OS. The semiconductor layer SM has, below the offset spacer OS and the sidewall spacer SW, an extension region EX1 which is a lightly-doped n type impurity region. The semiconductor layer SM has, on a portion thereof, an epitaxial layer EP. This epitaxial layer EP has therein a diffusion region D1 which is a more heavily-doped n type impurity region than the extension region EX1. These extension region EX1 and diffusion region D1 configure the source region or drain region of the MISFET1Tr.

The region TAn has, similar to the region An, the well region DNW and the well region PW therein. The well region PW has, on the surface thereof, a ground plane region GP1, but the region TAn does not necessarily have the ground plane region GP1 therein. As described above, since the insulating layer BX and the semiconductor SM are removed from the region TAn, an epitaxial layer EP is formed to have a direct contact with the well region PW including the ground plane region GP1. The epitaxial layer EP has therein a diffusion region D2 which is a p type impurity region. A voltage supplied to a plug PG in the region TAn is therefore supplied to the ground plane region GP1 in the region An via the epitaxial layer EP and the well region PW.

Next, the structure of the MISFET2Tr in the region Ap will be described.

In the region Ap, the semiconductor substrate SB has therein an n type well region NW. The well region NW contiguous to the insulating layer BX has, on the surface thereof, an n type ground plane region GP2 having a higher impurity concentration than the well region NW. The ground plane region GP2 functions as a back gate of the MISFET2Tr and the threshold voltage of the MISFET2Tr is adjusted by the internal potential of the ground plane region GP2.

The well region NW and the ground plane region GP2 have an n type impurity such as arsenic (As) introduced therein. The well region NW has an impurity concentration of from $5 \times 10^{17}$ to $5 \times 10^{18}$/cm$^3$ and the ground plane region GP2 has an impurity concentration of from about $1 \times 10^{18}$ to $2 \times 10^{19}$/cm$^3$.

The semiconductor layer SM in the region Ap has thereon a gate electrode G2 via a gate insulating film GF2. Here, the gate insulating film GF2 includes an insulating film IF1 made of a silicon oxide film or the like and a high dielectric constant film HK1 formed on the insulating film IF1. The high dielectric constant film HK1 has a higher dielectric constant than a silicon oxide film, serves to adjust the threshold of the MISFET2Tr, and includes the above-described first metal and the second metal. In the present embodiment, therefore, the gate insulating film GF1 and the gate insulating film GF2 are made of the same film.

The gate electrode G2 has, on the side surface thereof, a sidewall spacer SW via an offset spacer OS. The semiconductor layer SM below the offset spacer OS and the sidewall spacer SW has an extension region EX2 which is a lightly doped p type impurity region. The semiconductor layer SM has, on a portion thereof, an epitaxial layer EP. This epitaxial layer EP has therein a diffusion region D2 which is a more heavily-doped p type impurity region than the extension region EX2. These extension region EX2 and diffusion region D2 configure the source region or the drain region of the MISFET2Tr.

Similar to the region Ap, the region TAp has therein a well region NW. The well region NW has, on the surface thereof, a ground plane region GP2 but the region TAp does not necessarily have the ground plane region GP2. As described above, since the insulating layer BX and the semiconductor layer SM are removed from the region TAp, an epitaxial layer EP is formed to have a direct contact with the well region NW including the ground plane region GP2. The epitaxial layer EP has therein a diffusion region D1 which is an n type impurity region. A voltage supplied to a plug PG in the region TAp is therefore supplied to the ground plane region GP2 in the region Ap via the epitaxial layer EP and the well region NW.

The diffusion region D1 in the region An and the diffusion region D1 in the region TAp are n type impurity regions formed by the same step, which will be described later. Similarly, the diffusion region D2 in the region Ap and the diffusion region D2 in the region TAn are p type impurity regions formed by the same step.

The gate electrode G1, the gate electrode G2, and the epitaxial layer EP have thereon a silicide layer SI made of, for example, nickel silicide (NiSi) or cobalt silicide ($CoSi_2$) to reduce contact resistance between them and the plug PG.

The main surface in the region An, the region Ap, the region TAn, and the region TAp has thereon an interlayer insulating film IL1 to cover the MISFET1Tr and the MISFET2Tr. As the interlayer insulating film IL1, a film comprised only of a silicon oxide film, a film obtained by stacking a thick silicon oxide film on a silicon nitride film, or the like can be used. The interlayer insulating film IL1 has therein contact holes and a plurality of plugs PG is formed in the interlayer insulating film IL1 by filling the contact holes with a conductive film comprised mainly of tungsten (W) or the like. The plugs PG are each connected with the gate electrode G1, the gate electrode G2, or the epitaxial layer EP via the silicide layer SI.

The interlayer insulating film IL1 having the plugs PG buried therein has thereon an interlayer insulating film IL2. The interlayer insulating film IL2 has therein a wiring trench. By filling the wiring trench with a conductive film comprised mainly of, for example, copper, the interlayer insulating film IL2 has therein a wiring M1 connected with the plug PG.

<Main Characteristics of Semiconductor Device of Present Embodiment>

The MISFET1Tr and the MISFET2Tr are each a fully-depletion type transistor called SOTB (silicon-on-thin-buried oxide) and they have a gate length of 65 nm or less. To suppress a change in the threshold due to variations in impurities, the semiconductor layer SM which will be a channel region does not have threshold adjustment ions implanted therein. This means that the semiconductor layer SM which will be a channel region is an intrinsic semiconductor layer having no n type or p type impurity introduced therein. Even if the semiconductor layer SM has a p type impurity introduced therein, the concentration of the impurity is $1\times10^{13}/cm^3$ or less.

Such transistors are driven at a voltage as low as about 0.75 V and the current flowing through each of the semiconductor layers SM (channel region) is controlled using not only a voltage applied to the gate electrode G1 and the gate electrode G2 but also a voltage applied to the well region PW and the well region NW. In short, the MISFET1Tr is driven by supplying voltages to the gate electrode G1 and the well region PW, respectively. The MISFET2Tr is driven by supplying voltages to the gate electrode G2 and the well region NW, respectively.

In the present embodiment, since the semiconductor layer SM which will be a channel region is dopantless, the threshold voltage of the MISFET1Tr is determined mainly by the concentration of the impurity contained in the ground plane region GP1 and the total number of atoms of the metal contained in the high dielectric constant film HK1. Similarly, the threshold voltage of the MISFET2Tr is determined mainly by the concentration of the impurity contained in the ground plane region GP2 and the total number of atoms of the metal contained in the high dielectric constant film HK1.

The present inventors investigated the proportion of a metal contained in the high dielectric constant film HK1. The results will hereinafter be described referring to FIG. 2.

First, the present inventors investigated introduction of aluminum (Al) into the high dielectric constant film HK1 for the n type MISFET1Tr, but found that it excessively decreased the threshold voltage in the p type MISFET2Tr. As described above, adjustment of the threshold voltage can be achieved to a certain level by the ground plane region GP2, but this region is not suited for finer adjustment of the threshold voltage because the ground plane region GP2 is comprised of an impurity region. The fine adjustment of the threshold voltage is performed desirably by a metal in the high dielectric constant film HK1 but the investigation by the present inventors has revealed that aluminum is not optimum for the p type MISFET2Tr.

The present inventors therefore investigated introduction of not only aluminum but also hafnium (Hf) into the high dielectric constant film HK1. Introduction of hafnium into the high dielectric constant film HK1 in addition made it possible to design the p type MISFET2Tr to have an appropriate threshold voltage. It slightly decreased the threshold voltage in the n type MISFET1Tr, but the decrease was within an application range.

The investigation by the present inventors also revealed that aluminum in the high dielectric constant film HK1 degraded NBTI (negative bias temperature instability) in the p type MISFET2Tr.

Figure 2:
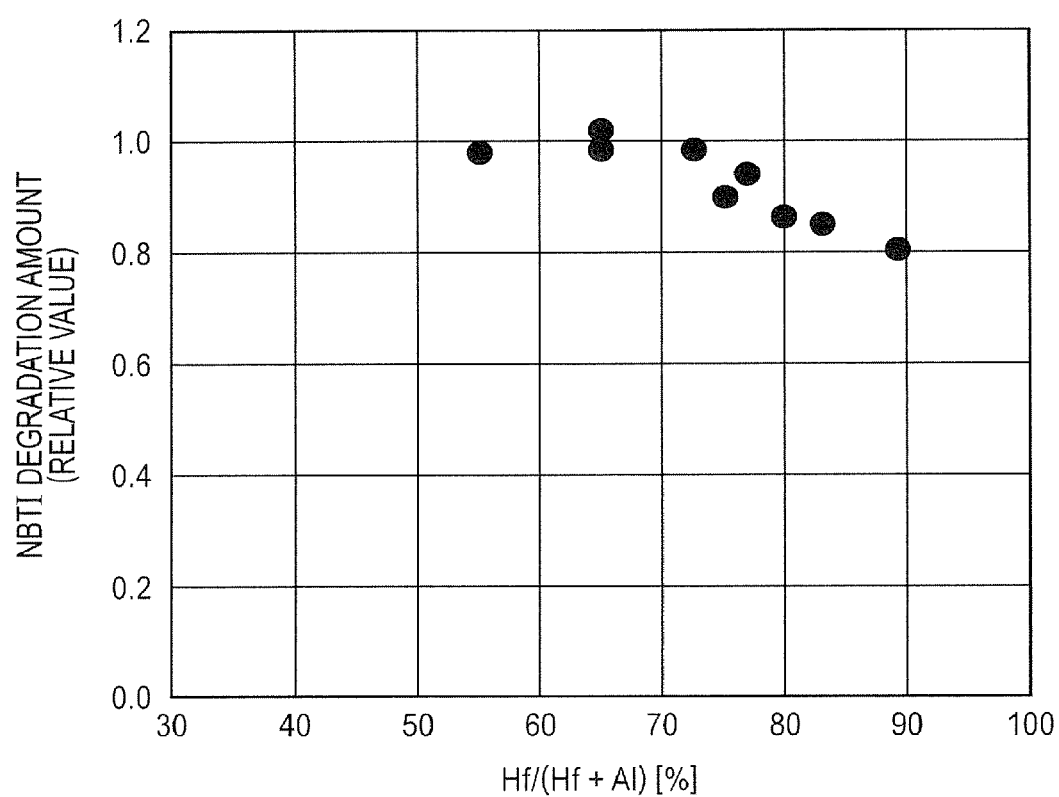
FIG. 2 shows experimental data obtained by the present inventors.

FIG. 2 shows data of the experiment made by the present inventors, more specifically, a degradation amount of NBTI of the p type MISFET2Tr depending on the proportion of the first metal (Hf) and the second metal (Al) contained in the high dielectric constant film HK1. The percentage of the number of atoms of the first metal (Hf) in the total number of atoms of the first metal and the second metal (Hf+Al) is plotted on the abscissa and an amount of degradation of NBTI of the p type MISFET2Tr is plotted as a relative value on the ordinate. Described specifically, with 1.0 of the ordinate as a standard, a value greater than 1.0 means that a NBTI degradation amount is greater and in this case, the MISFET2Tr has deteriorated reliability, while a value smaller than 1.0 means that a NBTI degradation amount is smaller and in this case, the MISFET2Tr has improved reliability.

As is apparent from FIG. 2, as the percentage of the first metal (Hf) contained in the high dielectric constant film HK1 increases and the percentage of the second metal (Al) contained in the high dielectric constant film HK1 decreases, the degradation in NBTI is reduced. In particular, it is apparent that the degradation in NBTI is reduced when the ratio of the number of atoms of the first metal (Hf) to the total number of atoms of the first metal and the second metal (Hf+Al) is equal to or more than 75%.

It is therefore desired to use, as the high dielectric constant film HK1, a film having the following composition: $Hf_xAl_{(1-x)}ON$ (1>X≥0.75) or $Hf_xAl_{(1-x)}O$ (1>X≥0.75). In other words, it is desired to adjust, in the high dielectric constant film HK1, the ratio of the number of atoms of the first metal (Hf) to the total number of atoms of the first metal and the second metal (Hf+Al) is equal to or more than 75%, and less than 100%. The p type MISFET2Tr having, as the high dielectric constant film HK1, a film having such a composition can have improved NBTI. In the semiconductor device of the present embodiment, the n type MISFET1Tr and the p type MISFET2Tr can have most suitably designed threshold voltages, respectively, and at the same time, the p type MISFET2Tr can have improved reliability.

<Method of Manufacturing Semiconductor Device of Present Embodiment>

The method of manufacturing the semiconductor device of the present embodiment will hereinafter be described referring to FIGS. 3 to 11.

Figure 3:
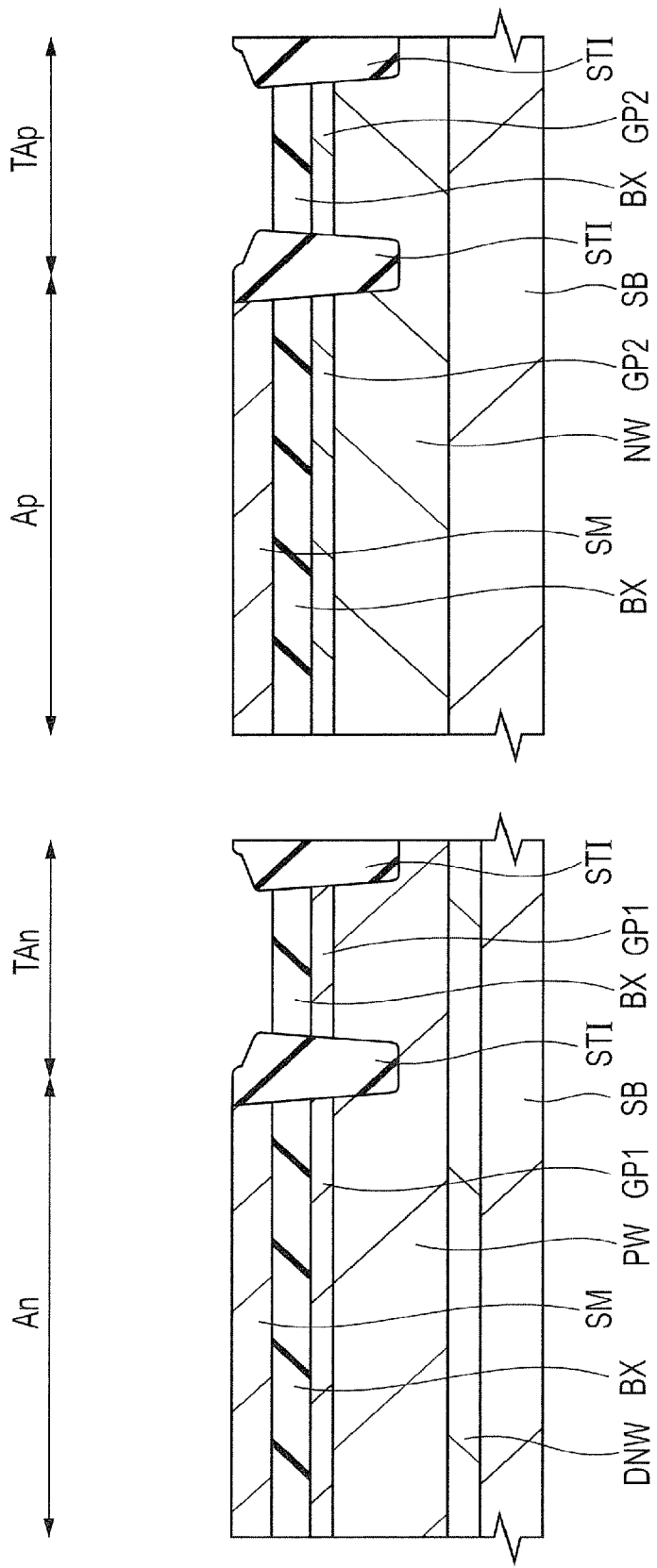
FIG. 3 is a cross-sectional view showing a manufacturing step of the semiconductor device of First Embodiment.

FIG. 3 shows a so-called SOI substrate having a semiconductor substrate SB serving as a support substrate, an insulating layer BX formed on the semiconductor substrate SB, and a semiconductor layer SM formed on the insulating layer BX.

The semiconductor substrate SB is made of single crystal silicon having a specific resistance of preferably from about 1 to 10 Ωcm. It is made of, for example, p type single crystal silicon. The insulating layer BX is made of, for example, silicon oxide and the insulating layer BX has a thickness of, for example, from about 10 to 20 nm. The semiconductor layer SM is made of single crystal silicon having a specific resistance of preferably from about 1 to 10 Ωcm and the semiconductor layer SM has a thickness of, for example, from about 10 to 20 nm. The semiconductor layer SM has no n type or p type impurity introduced therein by ion implantation or the like. It is therefore an intrinsic semiconductor layer. Even if the semiconductor layer SM has a p type impurity introduced therein, the concentration of the impurity is $1×10^{13}/cm^3$ or less.

The following is one example of a step of providing such an SOI substrate. The SOI substrate can be produced, for example, by SIMOX (separation by implanted oxygen) method. In the SIMOX method, oxygen ($O_2$) is ion-implanted at high energy into a semiconductor substrate made of silicon (Si) and silicon and oxygen are bonded by the subsequent heat treatment to form an insulating layer BX made of silicon oxide at a position a little deeper than the surface of the semiconductor substrate. In this case, the thin silicon film remaining on the insulating layer BX becomes the semiconductor layer SM and the semiconductor substrate below the insulating layer BX becomes the semiconductor substrate SB. The SOI substrate may also be formed by lamination method. In the lamination method, for example, after oxidization of the surface of a first semiconductor substrate made of silicon into an insulating layer BX, a second semiconductor substrate made of silicon is contact-bonded under high temperature to the resulting first semiconductor substrate and thus, they are laminated. Then, the second semiconductor substrate is made into a thin film. In this case, the thin film of the second semiconductor substrate remaining on the insulating layer BX becomes a semiconductor layer SM and the first semiconductor substrate below the insulating layer BX becomes a semiconductor substrate SB. Another method, for example, smart cut process can also be used for the production of the SOI substrate.

Next, a trench penetrating through the semiconductor layer SM and the insulating layer BX and reaching the semiconductor substrate SB is formed and then, the trench is filled with an insulating film to form an element isolation portion STI. The region An, the region Ap, the region TAn, and the region TAp are separated from each other by the element isolation portion STI.

Next, by photolithography and ion implantation, an n type well region DNW is formed in the semiconductor substrate SB in the region An and the region TAn, a p type well region PW is formed in the well region DNW, and a p type ground plane region GP1 is formed in the well region PW.

Next, by photolithography and ion implantation, an n type well region NW is formed in the semiconductor substrate SB in the regions Ap and TAp and an n type ground plane region GP2 is formed in the well region NW.

Next, by photolithography and dry etching, the semiconductor layer SM in the regions TAn and TAp are removed selectively to expose the insulating layer BX in the region TAn and the region TAp.

Figure 4:
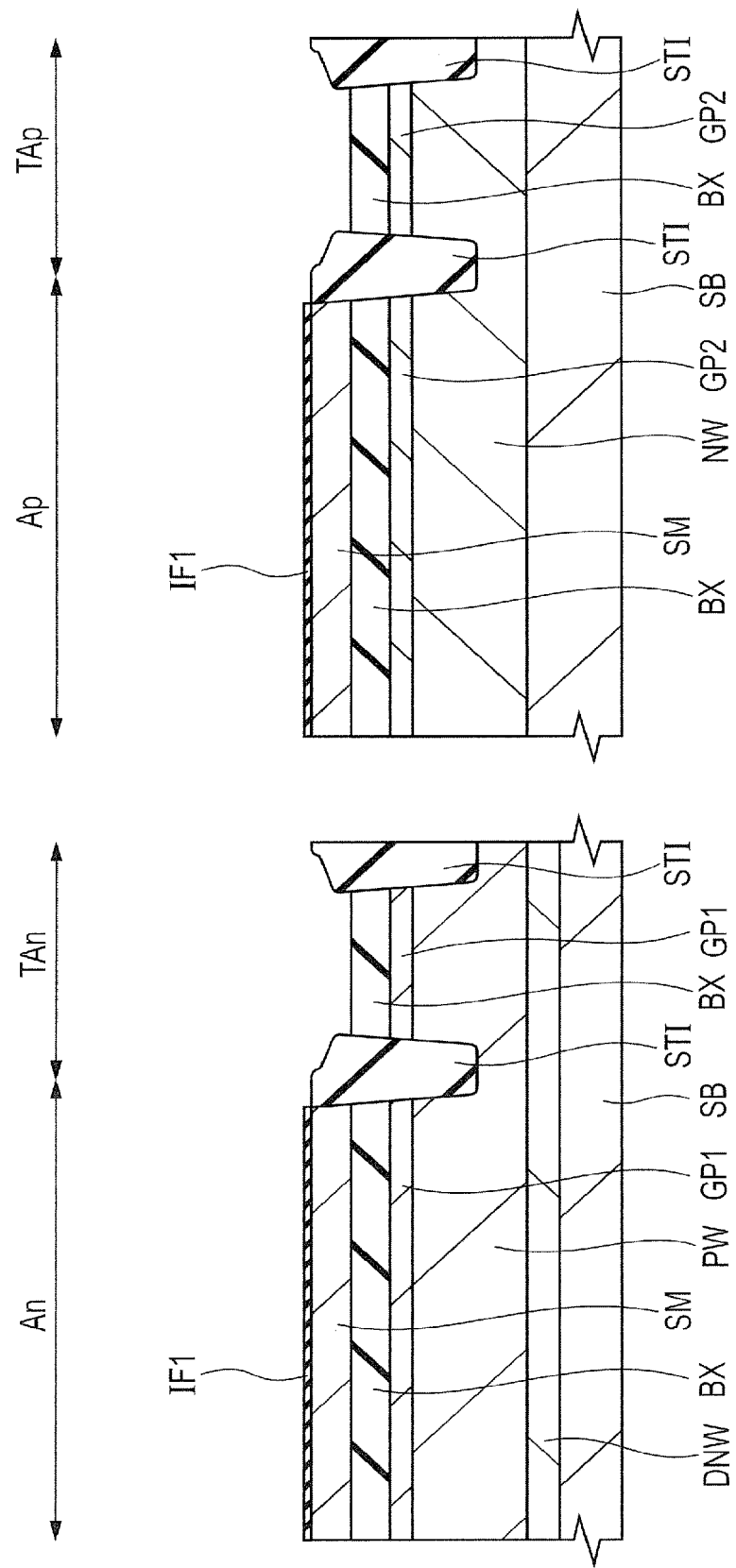
FIG. 4 is a cross-sectional view showing a manufacturing step of the semiconductor device following that of FIG. 3.

Next, as shown in FIG. 4, an insulating film IF1 made of, for example, a silicon oxide film is formed on the semiconductor layer SM in the region An and the region Ap, for example, by thermal oxidation. The insulating film IF1 has a thickness of from about 2 to 3 nm. This insulating film IF1 will become a portion of a gate insulating film GF1 of a MISFET1Tr and a portion of a gate insulating film GF2 of a MISFET2Tr later.

Next, a plasma treatment may be performed on the insulating film IF1, for example, in a nitrogen-containing atmosphere if necessary. The surface of the insulating film IF1 is nitrided by this plasma treatment. This means that the concentration of nitrogen introduced into an upper half portion, in terms of thickness, of the insulating film IF1 becomes higher than the concentration of nitrogen introduced into a lower half portion, in terms of thickness of the insulating film IF1. In other words, the lower portion of the insulating film IF1 is a silicon oxide film and the upper portion of the insulating film IF1 becomes a silicon oxynitride film.

Following advantages can be obtained by performing such plasma treatment. For example, gate electrodes G1 and G2 will be formed in subsequent steps, but impurities in the gate electrodes G1 and G2 may diffuse into the semiconductor layer SM by the heat treatment in the manufacturing steps performed after formation of these gate electrodes. By the above-described plasma treatment performed to nitride the surface of the insulating film IF1, for example, p type impurities such as boron (B) introduced into the gate electrode G2 can be prevented from diffusing toward the semiconductor layer SM from the gate electrode G2. In addition, since the surface of the insulating film IF1 made of a silicon oxide film is nitrided, the gate insulating film GF1 and the gate insulating film GF2 can have an improved dielectric constant.

In the present embodiment, a high dielectric constant film HK1 obtained by performing the above-described plasma treatment has the following composition: $Hf_xAl_{(1-x)}ON$ (1>X≥0.75) and a high dielectric constant film HK1 obtained without performing the above-described plasma treatment has the following composition: $Hf_xAl_{(1-x)}O$ (1>X≥0.75), which will be described later.

Figure 5:
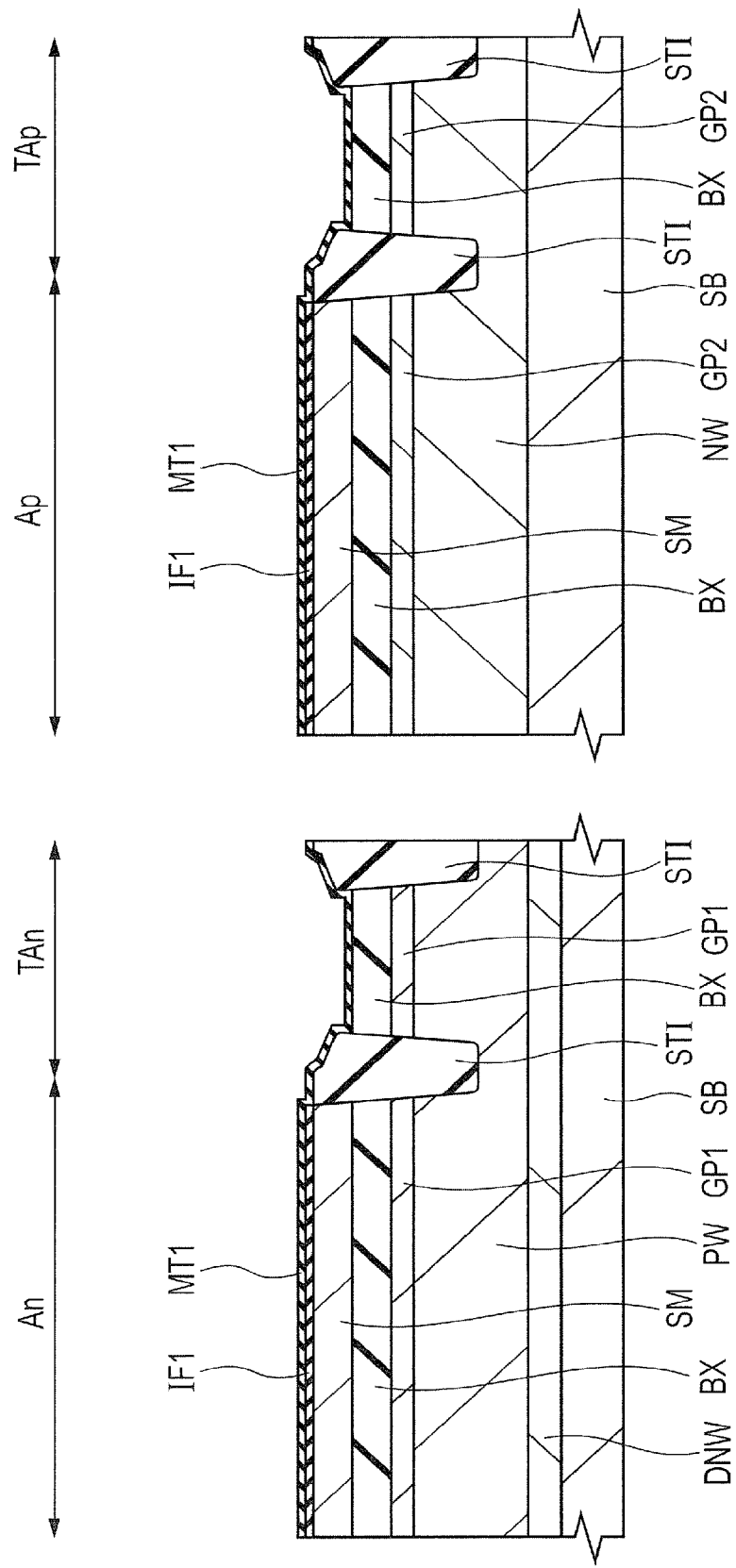
FIG. 5 is a cross-sectional view showing a manufacturing step of the semiconductor device following that of FIG. 4.

Next, as shown in FIG. 5, a metal film MT1 is deposited in the region An, the region Ap, the region TAn, and the region TAp by sputtering. The metal film MT1 is thereby formed on the insulating film IF1 in the region An and the region Ap. This means that a material configuring the metal film MT1 is added (supplied) to the insulating film IF1 in each of the region An and the region Ap. The metal film MT1 in the present embodiment contains a first metal (Hf) and a second metal (Al) and has a thickness of about 3 nm. The metal film MT1 is formed, for example, by depositing hafnium (Hf) in a first chamber in a sputtering apparatus. Then, aluminum (Al) is deposited in a second chamber in the same sputtering apparatus. Hafnium and aluminum may be deposited in any order. The ratio of the number of atoms of the first metal (Hf) to the total number of atoms of the first metal and the second metal (Hf+Al) is equal to or more than 75%, and less than 100%.

Next, the insulating film IF1 and the metal film MT1 are reacted by performing a heat treatment on the metal film MT1 at for example, about 700° C., to form a high dielectric constant film HK1. In the present embodiment, silicon oxide ($SiO_2$) contained in the surface of the insulating film IF1 reacts with hafnium (Hf) and aluminum (Al) contained in the metal film MT1 to form, as the high dielectric constant film HK1, a $Hf_xAl_{(1-x)}O$ film. When a plasma treatment is performed on the insulating film IF1 in a nitrogen atmosphere, silicon oxynitride (SiON) contained in the surface of the insulating film IF1 reacts with hafnium (Hf) and aluminum (Al) contained in the metal film MT1 to form, as the high dielectric constant film HK1, a $Hf_xAl_{(1-x)}ON$ film.

The reaction between the insulating film IF1 and the metal film MT1 may also be caused by making use of heat added in another step described later without independently carrying out such a heat treatment step.

Figure 6:
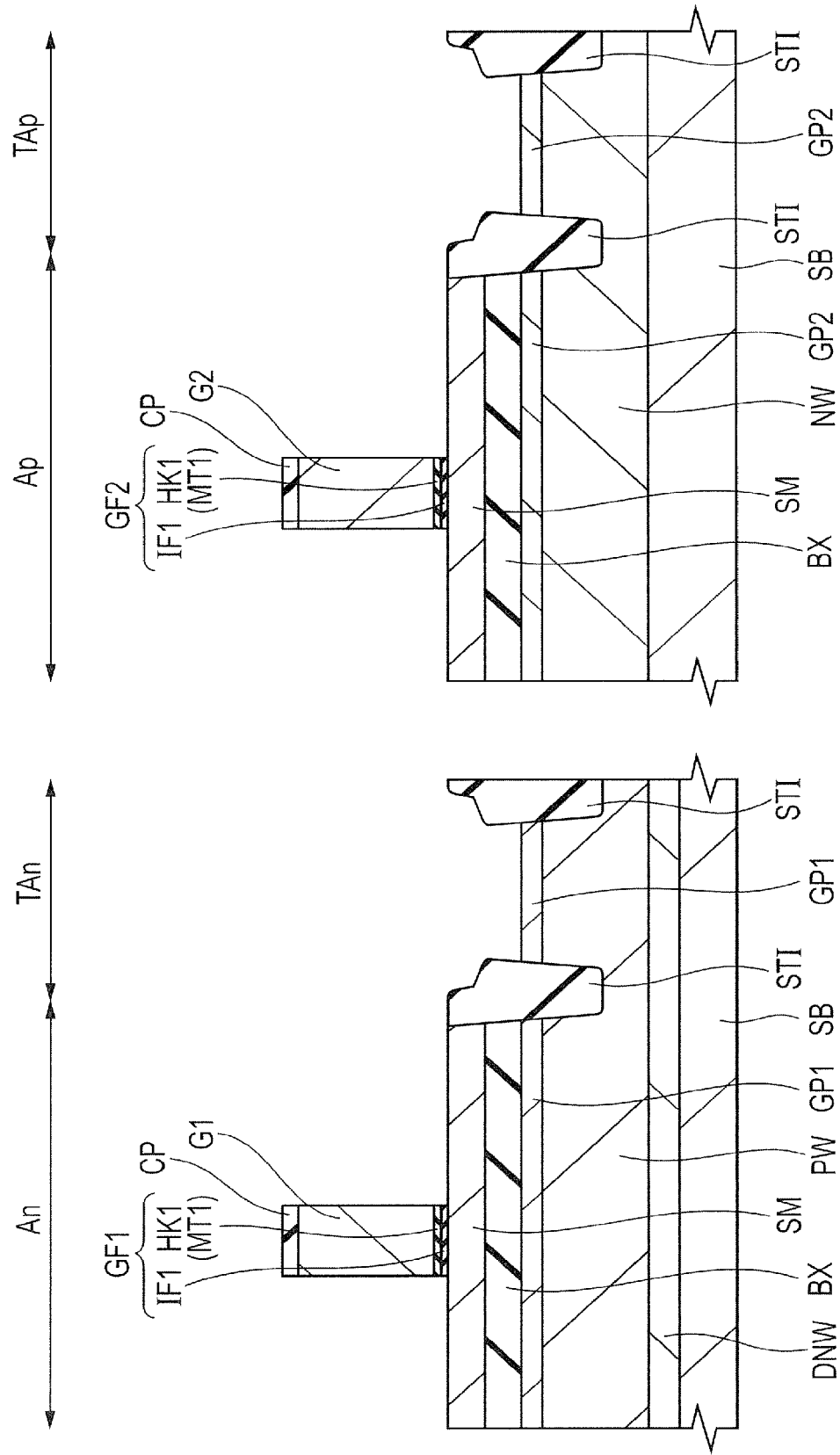
FIG. 6 is a cross-sectional view showing a manufacturing step of the semiconductor device following that of FIG. 5.

FIG. 6 shows manufacturing steps following that of FIG. 5 and by them, a gate electrode G1, a gate electrode G2, a cap film CP, a gate insulating film GF1, and a gate insulating film GF2 are formed.

First, as a conductive film for gate electrode, for example, a polycrystalline silicon film is deposited to cover the region An, the region Ap, the region TAn, and the region TAp, for example, by CVD. This CVD includes heat treatment at from about 600 to 700° C. Then, an impurity is introduced into the conductive film in each of these regions by photolithography and ion implantation. Here, an n type impurity is introduced into the conductive film in the region An and the region TAn, while a p type impurity is introduced into the conductive film in the region Ap and the region TAp.

The conductive film configuring each of the gate electrodes is not limited to the polycrystalline silicon film, but a metal film or a stacked film of a polycrystalline silicon film and a metal film may be used.

Next, as an insulating film for cap film on a gate electrode, for example, a silicon nitride film is deposited on the conductive film, for example, by CVD. This CVD includes heat treatment at from about 600 to 700° C.

Without independently performing the heat treatment step for reacting the insulating film IF1 and the metal film MT1 described just before the steps shown in FIG. 6, heat added in another step shown in FIG. 6 may also be used. For example, a high dielectric constant film HK1 can also be obtained by reacting the insulating film IF1 and the metal film MT1 by making use of the heat treatment applied during formation of the conductive film for gate electrode or formation of the insulating film for cap film. The reaction between the insulating film IF1 and the metal film MT1 may be caused by the heat treatment performed in the later step such as offset spacer OS formation step, dummy sidewall spacer DSW formation step, epitaxial layer EP formation step, sidewall spacer SW formation step, or activation treatment after formation of the diffusion regions D1 and D2. This means that even if the reaction between the insulating film IF1 and the metal film MT1 is not completed by the heat treatment performed at the time of forming the conductive film for gate electrode or at the time of forming the insulating film for cap film, the insulating film IF1 and the metal film MT1 can be caused to react by the heat treatment performed in each of the later steps. Anyway, after a silicide layer SI formation step shown in FIG. 9, the reaction between the insulating film IF1 and the metal film MTI has been completed and a $Hf_xAl_{(1-x)}ON$ film or a $Hf_xAl_{(1-x)}O$ film is present as the high dielectric constant film HK1.

Next, photolithography and dry etching are used to pattern the insulating film and the conductive film. By this patterning, a gate electrode G1 is formed in the region An and a gate electrode G2 is formed in the region Ap as shown in FIG. 6. In addition, a cap film CP is formed on each of the gate electrodes. Then, the high dielectric constant film HK1 (metal film MT1) and the insulating film IF1 exposed from each of the gate electrodes are removed to leave the high dielectric constant film HK1 and the insulating film IF1 below the gate electrode G1 in the region An and below the gate electrode G2 in the region Ap. In the step of removing the high dielectric constant film HK1 (metal film MT1), an aqueous solution containing nitric acid or sulfuric acid is used and in the step of removing the insulating film IF1, an aqueous solution containing hydrofluoric acid is used. Simultaneously with the removal of the insulating film IF1, the insulating layer BX remaining in the region TAn and the region TAp is also removed.

By the above-described steps, the gate insulating film GF1 including the high dielectric constant film HK1 and the insulating film IF1 is formed below the gate electrode G1 in the region An and a gate insulating film GF2 including the high dielectric constant film HK1 and the insulating film IF1 is formed below the gate electrode G2 in the region Ap.

Figure 7:
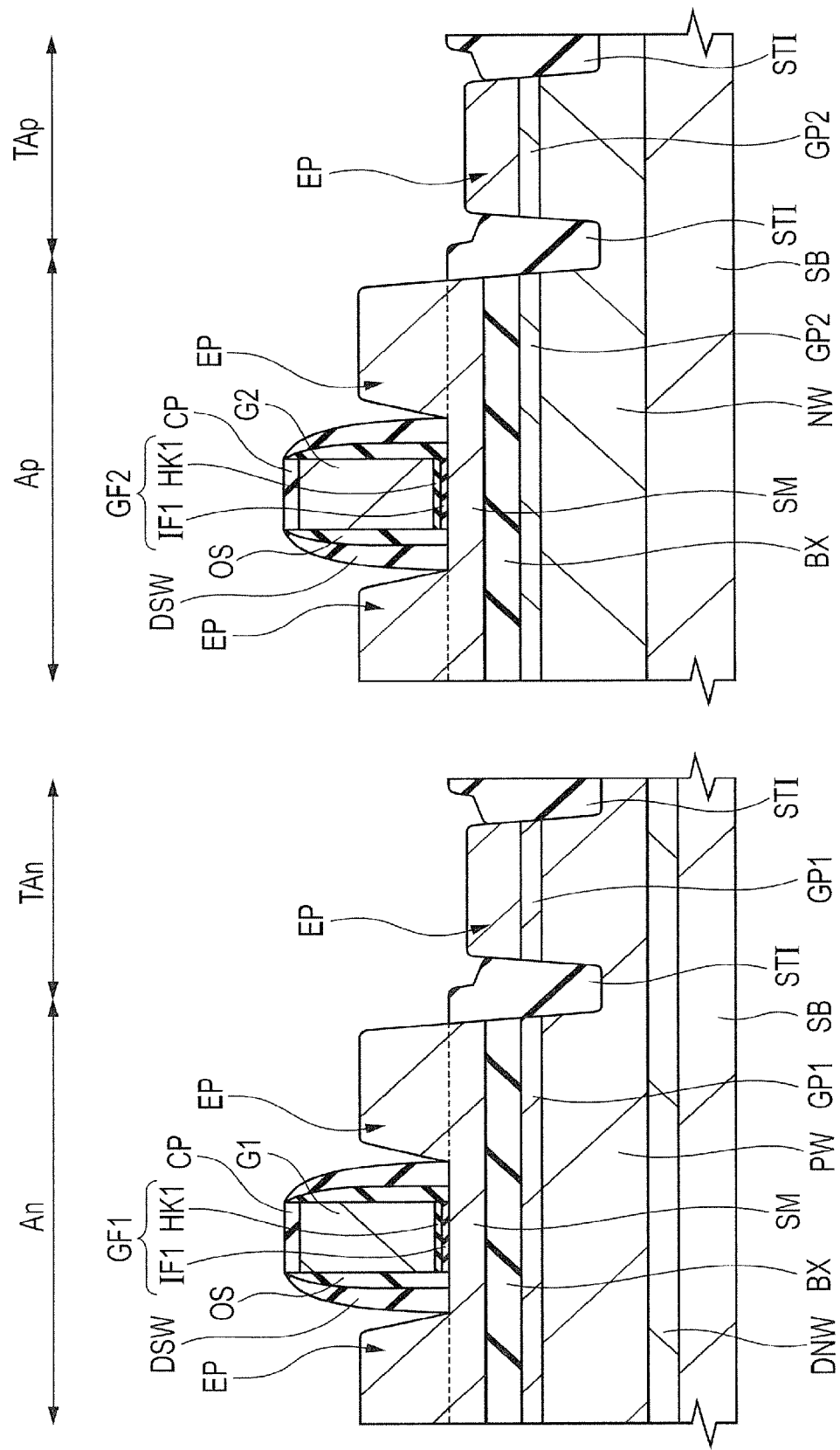
FIG. 7 is a cross-sectional view showing a manufacturing step of the semiconductor device following that of FIG. 6.

FIG. 7 shows the steps of forming an offset spacer OS, a dummy side wall spacer DSW, and an epitaxial layer EP.

First, an insulating film made of, for example, a silicon oxide film is formed, for example, by CVD to cover the region An, the region Ap, the region TAn, and the region TAp. This CVD includes heat treatment at from about 600 to 700° C. Then, the resulting insulating film is anisotropically etched to form an offset spacer OS on the side surface of each of the gate electrode G1 and the gate electrode G2. At this time, in the region TAn and the region TAp, the insulating film for offset spacer OS is removed by anisotropic etching and the semiconductor substrate SB is exposed.

Next, an insulating film made of, for example, a silicon nitride film is formed, for example, by CVD to cover the region An, the region Ap, the region TAn, and the region TAp. This CVD includes heat treatment at from about 600 to 700° C. Then, the resulting insulating film is anisotropically etched to form a dummy sidewall spacer DSW on the side surface of each of the gate electrode G1 and the gate electrode G2 via the offset spacer OS. At this time, from the regions TAn and TAp, the insulating film for dummy sidewall spacer DSW is removed by anisotropic etching and the semiconductor substrate SB is exposed.

Next, by epitaxial growth, an epitaxial layer EP made of, for example, single crystal silicon (semiconductor layer EP) is formed on the semiconductor substrate SM in the region An and the region Ap and the semiconductor substrate SB in the regions TAn and TAp. This epitaxial growth includes heat treatment at from about 650 to 750° C. The semiconductor layer EP has a thickness of from about 20 nm to 40 nm. Since the gate electrode G1 and the gate electrode G2 are covered with the cap film CP, no epitaxial layer EP is formed on the gate electrode G1 and the gate electrode G2.

The epitaxial layer EP and the semiconductor layer SM are integrated with each other because they are made of the same material. In the present embodiment, however, to facilitate understanding of the invention, the epitaxial layer EP is shown by an arrow and the boundary between the epitaxial layer EP and the semiconductor layer SM is shown by a dotted line.

Figure 8:
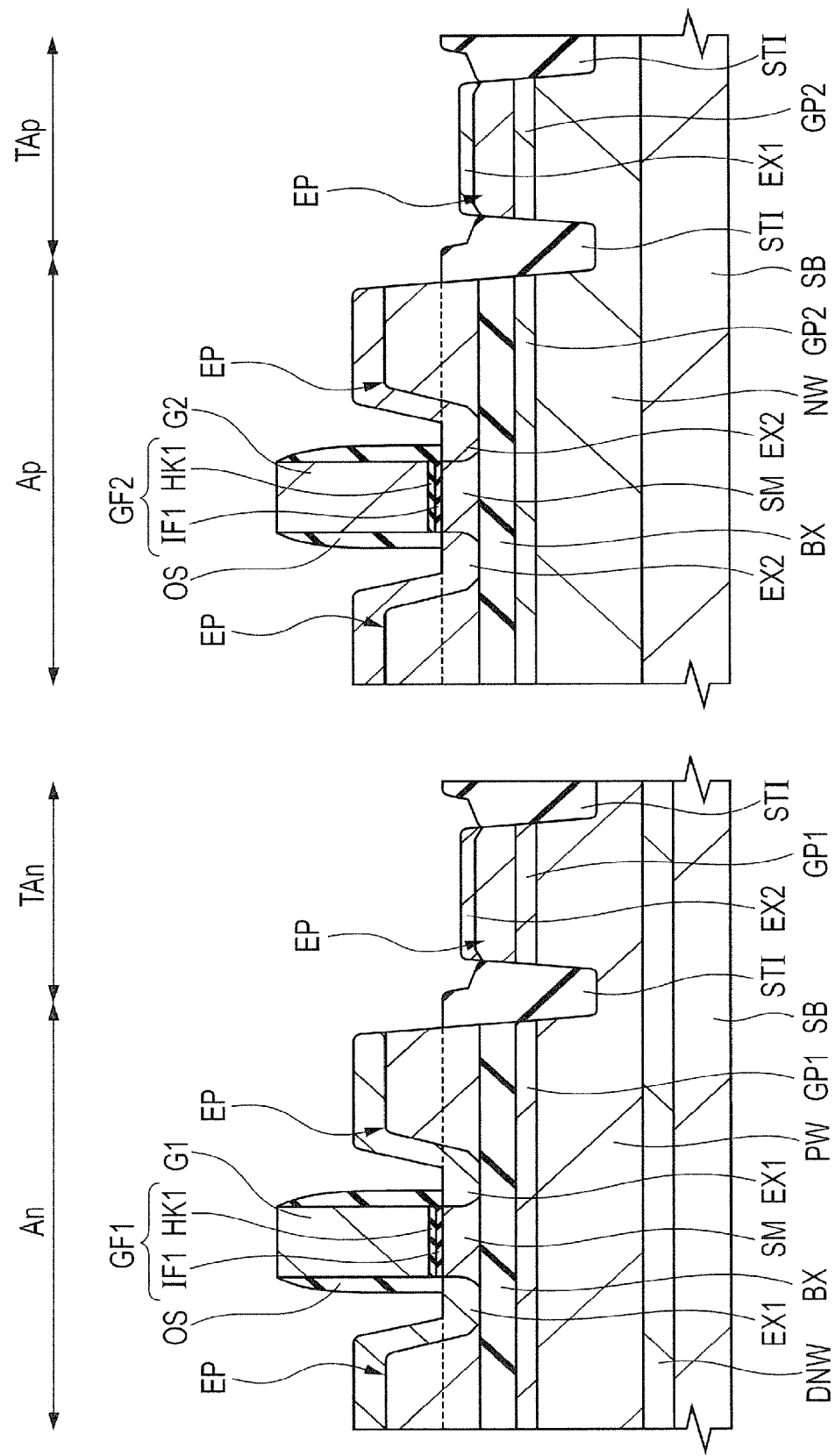
FIG. 8 is a cross-sectional view showing a manufacturing step of the semiconductor device following that of FIG. 7.

FIG. 8 shows the step of removing the dummy sidewall spacer DSW and the cap film CP and the step of forming extension regions EX1 and EX2.

First, etching is performed under conditions to prevent smooth etching of the offset spacer OS and the dummy sidewall spacer DSW and the cap film CP are thus removed from the regions An and Ap. The dummy sidewall spacer DSW and the cap insulating film CP are made of the same material such that they can be removed simultaneously. This makes it possible to simplify the manufacturing steps because addition of a mask is not required.

Next, photolithography and ion implantation are used to form an n type extension region (impurity region) EX1 in the semiconductor layer SM and the epitaxial layer EP on both sides of the gate electrode G1 in the region An and a p type extension region (impurity region) EX2 in the semiconductor layer SM and the epitaxial layer EP on both sides of the gate electrode G2 in the region Ap. The extension region EX1 configures a portion of the source region or drain region of the MISFET1Tr, while the extension region EX2 configures a portion of the source region or drain region of the MISFET2Tr.

The extension region EX1 is formed also on the surface of the epitaxial layer EP in the region TAp and the extension region EX2 is formed also on the surface of the epitaxial layer EP in the region TAn. It is however not always necessary to form the extension region EX1 and the extension region EX2 in the region TAp and the region TAn, respectively.

Figure 9:
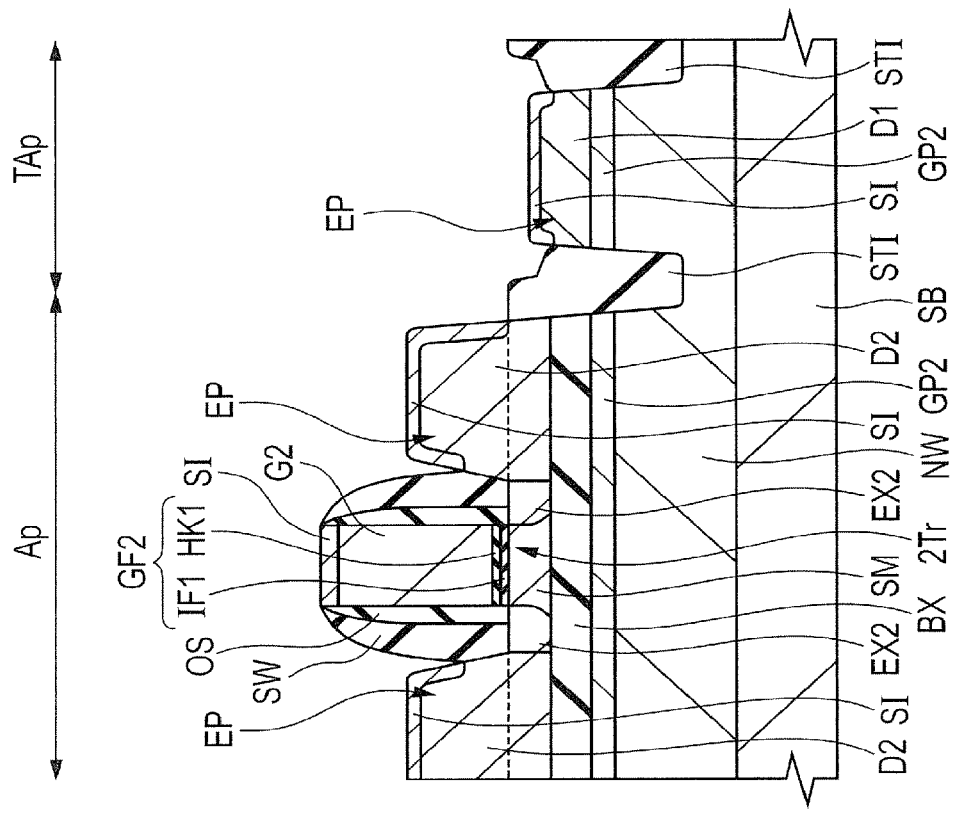
FIG. 9 is a cross-sectional view showing a manufacturing step of the semiconductor device following that of FIG. 8.
Figure 9:
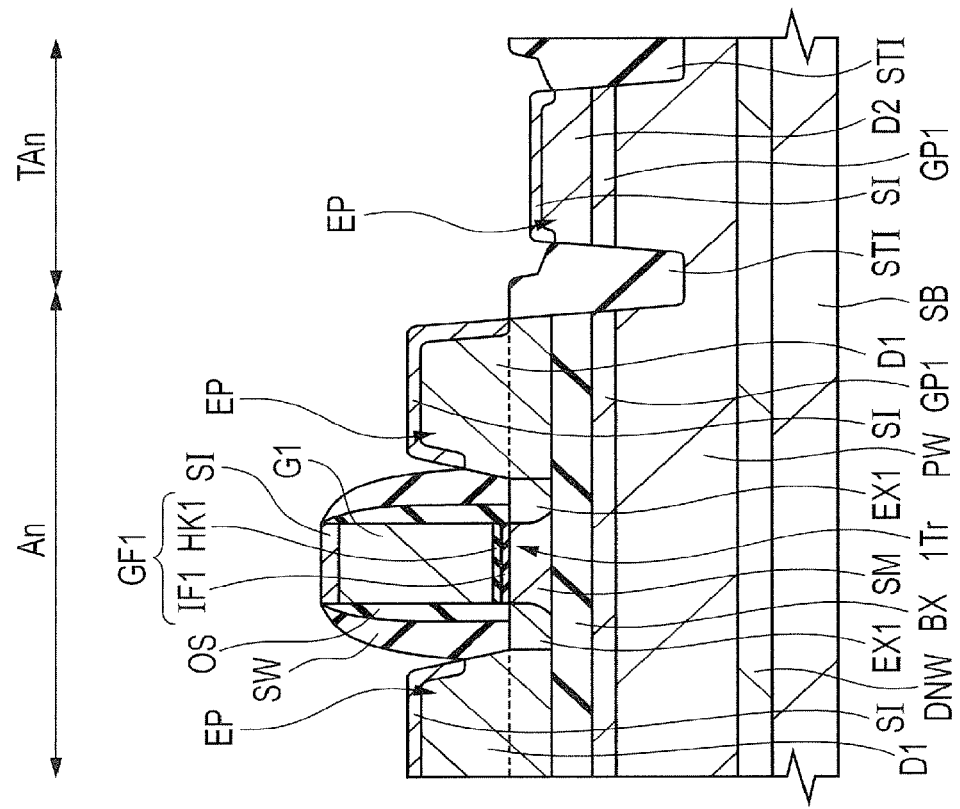

FIG. 9 shows the steps of forming a sidewall spacer SW, diffusion regions D1 and D2, and a silicide layer SI.

First, an insulating film made of, for example, a silicon nitride film is formed, for example, by CVD to cover the region An, the region Ap, the region TAn, and the region TAp. This CVD includes heat treatment at from 600 to 700° C. Then, the resulting insulating film is anisotropically etched to form a sidewall spacer SW on the side surface of each of the gate electrode G1 and the gate electrode G2 via the offset spacer OS.

Next, by photolithography and ion implantation, an n type diffusion region (impurity region) D1 is formed in the epitaxial layer EP and the semiconductor layer SM in the region An and in the epitaxial layer EP in the region TAP; and a p type diffusion region (impurity region) D2 is formed in the epitaxial layer EP and the semiconductor layer SM in the region Ap and in the epitaxial layer EP in the region TAn.

In the region An, the n type diffusion region D1 has a higher impurity concentration than the extension region EX1, is connected with the extension region EX1, and configures a portion of the source region or the drain region of the MISFET1Tr.

In the region Ap, the p type diffusion region D2 has a higher impurity concentration than the extension region EX2, is connected with the extension region EX2, and configures a portion of the source region or the drain region of the MISFET2Tr.

Then, the semiconductor substrate SB is heat treated at about 1050° C. with the purpose of activating impurities contained in the extension regions EX1 and EX2 and the diffusion regions D1 and D2.

Next, a low resistance silicide layer SI is formed on the upper surface of each of the diffusion region D1, the diffusion region D2, the gate electrode G1, and the gate electrode G2 by the salicide (self aligned silicide) technology.

Described specifically, the silicide layer SI can be formed as follows. First, a metal film for forming a silicide layer SI is formed to cover the region An, the region Ap, the region TAn, and the region TAp. This metal film is made of, for example, cobalt, nickel or nickel platinum alloy. Next, the semiconductor substrate SB is heat treated at from about 600 to 700° C. to cause a reaction between the metal film and the diffusion region D1, the diffusion region D2, the gate electrode G1, and the gate electrode G2. As a result, the silicide layer SI is formed on the upper surface of each of the diffusion region D1, the diffusion region D2, the gate electrode G1, and the gate electrode G2. Then, an unreacted portion of the metal film is removed.

By the above-described steps, the MISFET1Tr is formed in the region An and the MISFET2Tr is formed in the region Ap.

After the manufacturing step shown in FIG. 9, interlayer insulating films IL1 and IL2, a plug PG, and a wiring M1 are formed and as a result, manufacture of the semiconductor device shown in FIG. 1 is completed.

First, an interlayer insulating film IL1 is formed to cover the region An, the region Ap, the region TAn, and the region TAp. As the interlayer insulating film IL1, a film comprised only of a silicon oxide film or a stacked film obtained by forming a silicon nitride film and then forming thereon a thick silicon oxide film can be used. After formation of the interlayer insulating film IL1, the upper surface of the interlayer insulating film IL1 can be polished by CMP (chemical mechanical polishing) as needed.

Next, by photolithography and dry etching, contact holes are formed in the interlayer insulating film IL1 and then, a plurality of plugs PG is formed in the interlayer insulating film IL1 by filling the contact holes with a conductive film comprised mainly of tungsten (W) or the like. The plug PG formed in each of the regions is connected with the diffusion regions D1 and D2 via the silicide layer SI. Although the gate electrodes G1 and G2 are also connected with the plug PG, the illustration of this connection is omitted in the present embodiment.

Next, an interlayer insulating film IL2 is formed on the interlayer insulating film IL1 having the plug PG buried therein. Then, after formation of a wiring trench in the interlayer insulating film IL2, the wiring trench is filled with a conductive film comprised mainly of, for example, copper to form, in the interlayer insulating film IL2, a wiring M1 to be connected with the plug PG. The structure of this wiring M1 is a so-called "damascene" wiring structure.

Then, second and higher wirings are formed by the dual damascene method or the like but description and illustration of them are omitted herein. The structure of the wiring M1 and wirings above the wiring M1 is not limited to the damascene wiring structure and it can be formed by patterning a conductive film. For example, a tungsten wiring or an aluminum wiring can be used.

Thus, the semiconductor device of the present embodiment is manufactured.

Second Embodiment

A semiconductor device and method of manufacturing the same according to Second Embodiment will hereinafter be described referring to FIGS. 10 to 12. In the following description, a difference from First Embodiment will be described mainly.

First Embodiment uses the same high dielectric constant film HK1 as a portion of the gate insulating film GF1 and a portion of the gate insulating film GF2. Second Embodiment, on the other hand, uses a high dielectric constant film HK2 as a portion of the gate insulating film GF1 and a high dielectric constant film HK3, which is made of a material different from that of the high dielectric constant film HK2, as a portion of the gate insulating film GF2.

Figure 10:
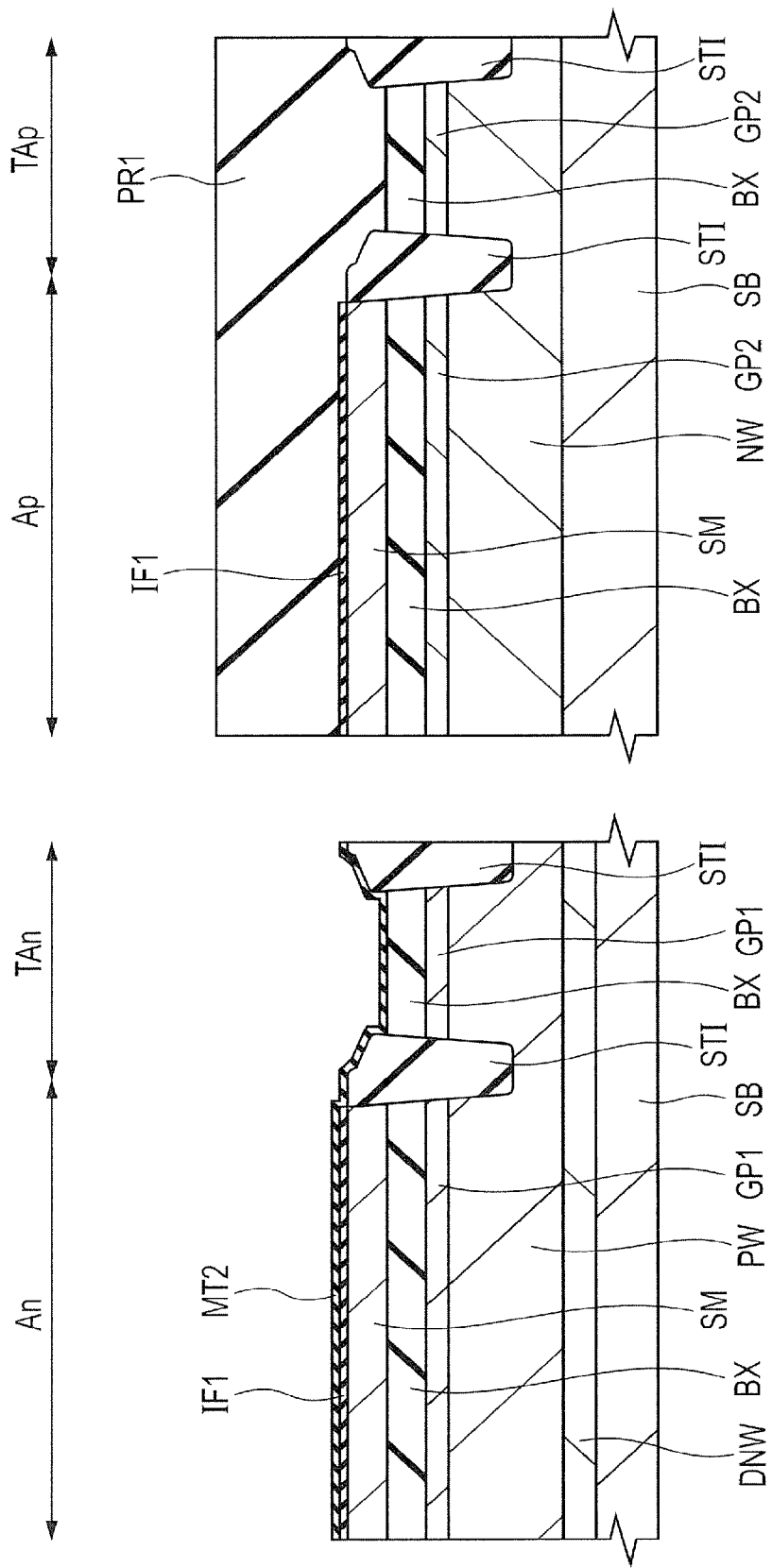
FIG. 10 is a cross-sectional view showing a manufacturing step of a semiconductor device of Second Embodiment.

FIG. 10 shows a manufacturing step following that of FIG. 4 of First Embodiment. At the time of completion of the manufacturing step of FIG. 4, the semiconductor layer SM has thereon an insulating film IF1 in the region An and the region Ap. In addition, a plasma treatment is performed on a surface of the insulating film IF1 in a nitrogen atmosphere if necessary.

Then, as shown in FIG. 10, a mask pattern PR1 made of, for example, a photoresist film is formed to expose the region An and the region TAn and cover the region Ap and the region TAp. The mask pattern PR1 is not limited to the photoresist film and it may also be a patterned insulating film such as silicon nitride film.

Next, with the mask pattern PR1 as a mask, a metal film MT2 made of, for example, aluminum (Al) is deposited by sputtering in the region An and the region TAn. Thus, the metal film MT2 is formed on the insulating film IF1 in the region An. This means that aluminum configuring the metal film MT2 is added (supplied) to the insulating film IF1 positioned in the region An. The metal film MT2 has a thickness of about 3 nm. Then, the mask pattern PR1 is removed by etching treatment such as ashing.

Figure 11:
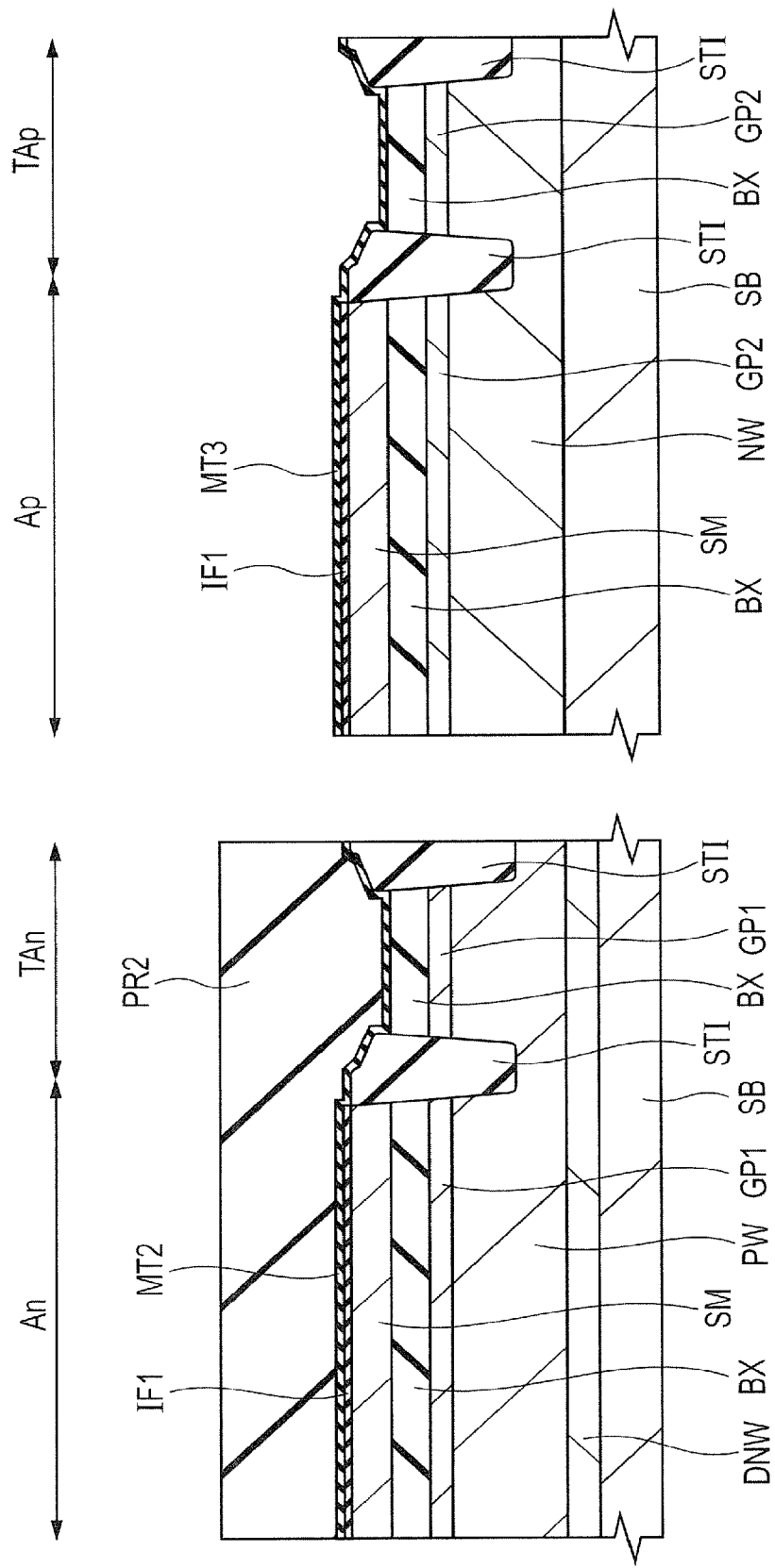
FIG. 11 is a cross-sectional view showing a manufacturing step of the semiconductor device following that of FIG. 10.

Next, as shown in FIG. 11, a mask pattern PR2 made of, for example, a photoresist film is formed to expose the region Ap and the region TAp and to cover the region An and the region TAn. The mask pattern PR2 is not limited to the photoresist film and it may also be a patterned insulating film such as silicon nitride film.

Next, with the mask pattern PR2 as a mask, a metal film MT3 made of, for example, hafnium (Hf) is deposited as a metal film different from the metal film MT2 by sputtering in the region Ap and the region TAp. Thus, the metal film MT3 is formed on the insulating film IF1 in the region Ap. This means that hafnium configuring the metal film MT3 is added (supplied) to the insulating film IF1 positioned in the region Ap. The metal film MT3 has a thickness of about 3 nm. Then, the mask pattern PR2 is removed by etching treatment such as ashing.

The order of the manufacturing steps shown in FIGS. 10 and 11 may be reversed. This means that after formation of the metal film MT3 in the region Ap, the metal film MT2 may be formed in the region An.

Figure 12:
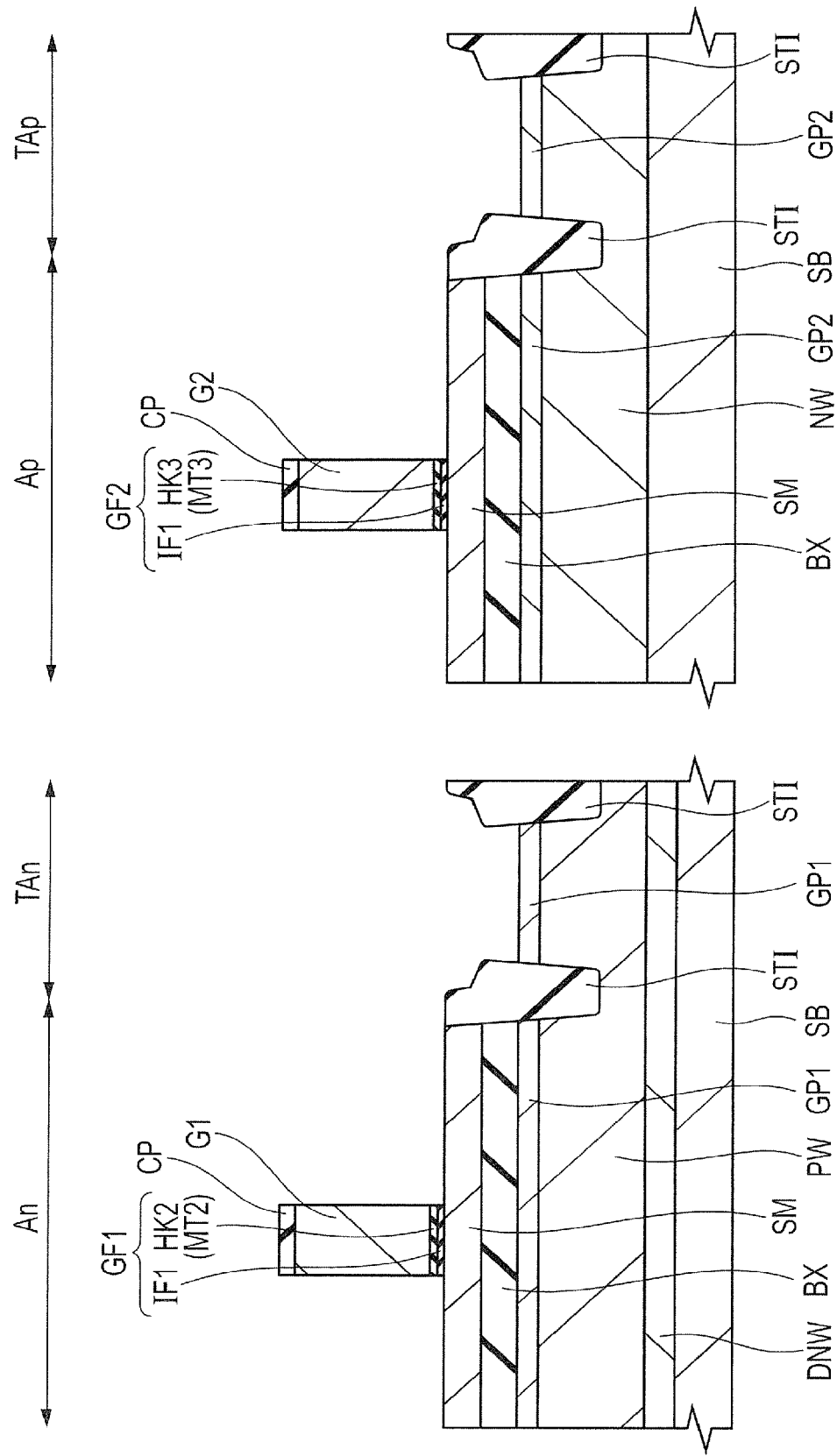
FIG. 12 is a cross-sectional view showing a manufacturing step of the semiconductor device following that of FIG. 11.

Next, as shown in FIG. 12, a gate electrode G1, a gate electrode G2, a cap film CP, a gate insulating film GF1, and a gate insulating film GF2 are formed by methods similar to those of First Embodiment, respectively. As a result, the gate insulating film GF1 including the high dielectric constant film HK2 and the insulating film IF1 is formed below the gate electrode G1 in the region An and the gate insulating film GF2 including the high dielectric constant film HK3 and the insulating film IF1 is formed below the gate electrode G2 in the region Ap.

Described specifically, as in First Embodiment, by performing a heat treatment on the metal film MT2 and the metal film MT3, the metal film MT2 and the insulating film IF1 in the region An are reacted to form a high dielectric constant film HK2, and the metal film MT3 and the insulating film IF1 in the region Ap are reacted to form a high dielectric constant film HK3. In Second Embodiment, the high dielectric constant film HK2 is an $AlO_2$ film or AlON film, while the high dielectric constant film HK3 is a $HfO_2$ film or HfON film.

As in First Embodiment, it is also possible to make use of

What is claimed is:

1. A method of manufacturing a semiconductor device, comprising the steps of:
   (a) providing a semiconductor substrate, an insulating layer formed on the semiconductor substrate, and a semiconductor layer formed on the insulating layer;
   (b) forming a first insulating film on the semiconductor layer;
   (c) depositing a metal film on the first insulating film by sputtering; and
   (d) reacting the metal film and the first insulating film by performing a heat treatment on the metal film,
   wherein the metal film contains a first metal and a second metal different from the first metal, and
   wherein the ratio of the number of atoms of the first metal to the total number of atoms of the first metal and the second metal is equal to or more than 75%, and less than 100%.

2. The method of manufacturing a semiconductor device according to claim 1,
   wherein the first metal is Hf, and
   wherein the second metal is Al.

3. The method of manufacturing a semiconductor device according to claim 2,
   wherein in the step (d), the metal film is caused to react with the first insulating film to form, on the first insulating film, a high dielectric constant film having a higher dielectric constant than a silicon oxide film, and
   wherein a first gate insulating film of a p type first MISFET includes the first insulating film and the high dielectric constant film.

4. The method of manufacturing a semiconductor device according to claim 3,
   wherein the semiconductor device is equipped with a first region in which the first MISFET is to be formed and a second region in which an n type second MISFET is to be formed,
   wherein in the step (b), a first insulating film is formed on the semiconductor layer in the first region and the second region,
   wherein in the step (c), the metal film is formed on the first insulating film in the first region and the second region, wherein in the step (d), the high dielectric constant film is formed on the first insulating film in the first region and the second region, and wherein a second gate insulating film of the second MISFET includes the first insulating film and the high dielectric constant film.

5. The method of manufacturing a semiconductor device according to claim 2, further comprising the step of:

after the step (b) but before the step (c), performing a plasma treatment on the surface of the first insulating film in a nitrogen-containing atmosphere.

6. The method of manufacturing a semiconductor device according to claim 1, wherein the step (d) is a step of forming a conductive film on the metal film, and wherein the heat treatment in the step (d) is heat treatment applied at the time of forming the conductive film.

7. A method of manufacturing a semiconductor device having a first region in which a first MISFET having a first conductivity type is to be formed and a second region in which a second MISFET having a second conductivity type opposite to the first conductivity type is to be formed, comprising the steps of:

(a) providing a semiconductor substrate, an insulating layer formed on the semiconductor substrate, and a semiconductor layer formed on the insulating layer;

(b) forming a first insulating film on the semiconductor layer in the first region and the second region;

(c) after the step (b), forming a first mask pattern that exposes the first region and covers the second region;

(d) after the step (c), depositing a first metal film on the first insulating film by sputtering, while having the first mask pattern;

(e) after the step (b), forming a second mask pattern that exposes the second region and covers the first region;

(f) after the step (e), depositing a second metal on the first insulating film by sputtering while having the second mask pattern;

(g) after the steps (c) to (f), by performing a heat treatment on the first metal film and the second metal film, reacting the first metal film and the first insulating film in the first region, and reacting the second metal film and the first insulating film in the second region.

8. The method of manufacturing a semiconductor device according to claim 7, wherein the first conductivity type is a p type, wherein the second conductivity type is an n type, wherein the first metal film is a Hf film, and wherein the second metal film is an Al film.

9. The method of manufacturing a semiconductor device according to claim 7, further comprising the step of:

after the step (b) but before the steps (c) to (f), performing a plasma treatment on a surface of the first insulating film in a nitrogen-containing atmosphere.

10. The method of manufacturing a semiconductor device according to claim 7, wherein the step (g) is a step of forming a conductive film on the first metal film and the second metal film, and wherein the heat treatment in the step (g) is heat treatment applied at the time of forming the conductive film.

* * * * *